United States Patent
Konrath et al.

(10) Patent No.: US 11,322,596 B2
(45) Date of Patent: May 3, 2022

(54) SEMICONDUCTOR DEVICE INCLUDING JUNCTION MATERIAL IN A TRENCH AND MANUFACTURING METHOD

(71) Applicant: Infineon Technologies AG, Neubiberg (DE)

(72) Inventors: Jens Peter Konrath, Villach (AT); Caspar Leendertz, Munich (DE); Larissa Wehrhahn-Kilian, Erlangen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/550,146

(22) Filed: Aug. 23, 2019

(65) Prior Publication Data

US 2020/0066857 A1    Feb. 27, 2020

(30) Foreign Application Priority Data

Aug. 24, 2018  (DE) .......................... 102018120734.4

(51) Int. Cl.
| | | |
|---|---|---|
| *H01L 29/66* | (2006.01) | |
| *H01L 29/423* | (2006.01) | |
| *H01L 29/78* | (2006.01) | |
| *H01L 29/16* | (2006.01) | |
| *H01L 21/02* | (2006.01) | |
| *H01L 29/739* | (2006.01) | |
| *H01L 21/04* | (2006.01) | |
| *H01L 29/47* | (2006.01) | |

(52) U.S. Cl.
CPC .... *H01L 29/4236* (2013.01); *H01L 21/02529* (2013.01); *H01L 21/0455* (2013.01); *H01L 29/1608* (2013.01); *H01L 29/47* (2013.01); *H01L 29/7397* (2013.01); *H01L 29/7827* (2013.01)

(58) Field of Classification Search
CPC ........... H01L 21/02378; H01L 29/1608; H01L 29/1604; H01L 29/161–167; H01L 21/044–0495; H01L 29/66053–66068; H01L 21/18–326; C01B 32/956–984
See application file for complete search history.

(56) References Cited

U.S. PATENT DOCUMENTS

| | | | | |
|---|---|---|---|---|
| 2008/0135889 A1* | 6/2008 | Session | ............... | H01L 29/8725 257/284 |
| 2009/0283776 A1* | 11/2009 | Iwamuro | ............. | H01L 29/7811 257/76 |
| 2012/0261676 A1* | 10/2012 | Nakano | ............. | H01L 29/41741 257/77 |
| 2017/0077299 A1 | 3/2017 | Shimizu et al. | | |
| 2017/0200787 A1 | 7/2017 | Shimizu | | |
| 2017/0345818 A1 | 11/2017 | Rupp et al. | | |

* cited by examiner

*Primary Examiner* — Calvin Y Choi
(74) *Attorney, Agent, or Firm* — Cooper Legal Group, LLC (57) ABSTRACT

An embodiment of a semiconductor device comprises a SiC semiconductor body, a gate dielectric and a gate electrode. A first trench extends from a first surface of the SiC semiconductor body into the SiC semiconductor body. A junction material is in the first trench, wherein the junction material and the SiC semiconductor body form a diode.

21 Claims, 6 Drawing Sheets

SEMICONDUCTOR DEVICE INCLUDING JUNCTION MATERIAL IN A TRENCH AND MANUFACTURING METHOD

RELATED APPLICATION

This application claims priority to German Patent Application No. 102018120734.4, filed on Aug. 24, 2018, entitled "SEMICONDUCTOR DEVICE INCLUDING JUNCTION MATERIAL IN A TRENCH AND MANUFACTURING METHOD", which is incorporated herein.

TECHNICAL FIELD

The present disclosure is related to semiconductor devices, for example to silicon carbide (SiC) semiconductor devices and manufacturing methods therefor.

BACKGROUND

Semiconductor devices including field effect transistor cells include pn junctions between a drift zone and body regions of the field effect transistor cells. The pn junctions form an intrinsic body diode. In a forward biased mode of the semiconductor device, the body diode is biased in forward direction and a bipolar current of electrons and holes passes the drift zone and the body regions. The forward voltage drop across the body diode and electrical losses caused by the body diode result from parameters, e.g., dimensions of doped regions and dopant concentrations in doped regions, which are typically selected in view of the desired properties of the field effect transistor cells.

There is a need to improve semiconductor devices based on silicon carbide.

SUMMARY

An embodiment of the present disclosure relates to a semiconductor device that includes a SiC semiconductor body, a gate dielectric in contact with the SiC semiconductor body and a gate electrode in contact with the gate dielectric. The semiconductor device further includes a first trench extending from a first surface of the SiC semiconductor body into the SiC semiconductor body, and a junction material in the first trench, wherein the junction material and the SiC semiconductor body form a diode.

An embodiment of the present disclosure relates to a semiconductor device that includes a SiC semiconductor body, and a trench extending from a first surface of the SiC semiconductor body into the SiC semiconductor body. The semiconductor device further includes a gate dielectric adjoining a first sidewall and a bottom of the trench, and a junction material adjoining a second sidewall of the trench and the bottom of the trench, wherein the junction material and the SiC semiconductor body form a diode.

An embodiment of the present disclosure relates to a method of manufacturing a semiconductor device. The method comprises providing a SiC semiconductor body. The method further comprises forming a gate dielectric in contact with the SiC semiconductor body and a gate electrode in contact with the gate dielectric. The method further comprises forming a first trench extending from a first surface of the SiC semiconductor body into the SiC semiconductor body. The method further comprises forming a junction material in the first trench, wherein the junction material and the SiC semiconductor body form a diode.

An embodiment of the present disclosure relates to a method of manufacturing a semiconductor device. The method comprises providing a SiC semiconductor body. The method further comprises forming a trench extending from a first surface of the SiC semiconductor body into the SiC semiconductor body. The method further comprises forming a gate dielectric adjoining a first sidewall and a bottom of the trench. The method further comprises forming a junction material adjoining a second sidewall of the trench and the bottom of the trench, wherein the junction material and the SiC semiconductor body form a diode.

BRIEF DESCRIPTION OF THE DRAWINGS

The accompanying drawings are included to provide a further understanding the embodiments and are incorporated in and constitute a part of this specification. The drawings illustrate the embodiments of the semiconductor device and the method of manufacturing a semiconductor device and together with the description serve to explain principles of the embodiments. Further embodiments are described in the following detailed description and the claims.

DETAILED DESCRIPTION

In the following detailed description, reference is made to the accompanying drawings, which form a part thereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. A parameter y with a value of at least c reads as c≤y and a parameter y with a value of at most d reads as y≤d.

A safe operating area (SOA) defines voltage and current conditions over which a semiconductor device can be expected to operate without self-damage. The SOA is given by published maximum values for device parameters like maximum continuous load current, maximum gate voltage and others.

IGFETs (insulated gate field effect transistor) are voltage controlled devices including MOSFETs (metal oxide semiconductor FETs) and other FETs with gate electrodes based on doped semiconductor material and/or with gate dielectrics that are not or not exclusively based on an oxide.

According to an embodiment a semiconductor device may include a silicon carbide, SiC semiconductor body. The semiconductor device may further include a gate dielectric in contact with the SiC semiconductor body and a gate electrode in contact with the gate dielectric. The semiconductor device may further include a first trench extending from a first surface of the SiC semiconductor body into the SiC semiconductor body. The semiconductor device may further include a junction material in the first trench. The junction material and the SiC semiconductor body may form a diode.

The SiC semiconductor body may be from a hexagonal phase of silicon carbide, e.g., 4H—SiC. The <0001> crystal axis may be tilted by an off-axis angle α to a surface normal the first surface. The <11-20> crystal axis may be tilted by the off-axis angle α with respect to the horizontal plane. The <1-100> crystal axis may be orthogonal to the cross-sectional plane. The off-axis angle α may be in a range from 2° to 8°. For example, the off-axis angle α may be 4°.

The gate dielectric and the gate electrode may define a gate structure. The gate dielectric may include or consist of one layer or a combination of layers, e.g. a layer stack of dielectric layers, for example oxide layers such as thermal oxide layers or deposited oxide layers, e.g. LPCVD (Low Pressure Chemical Vapor Deposition) oxides using tetraethyl orthosilicate (TEOS) as precursor, PECVD (Plasma Enhanced Chemical Vapor Deposition) oxides, undoped silicate glass (USG), phosphosilicate glass (PSG), boron silicate glass (BSP), borophosphosilicate glass (BPSG), nitride layers, high-k dielectric layers and/or low-k dielectric layers.

The gate electrode may include or consist of one or a combination of electrode materials, for example doped semiconductor material such as doped polycrystalline silicon, metal or metal compounds.

According to an embodiment, the gate structure may be a planar gate structure. A planar gate structure is a gate structure having the gate dielectric and the gate electrode arranged on the first surface of the SiC semiconductor body. A flow direction of a current through the channel of a planar gate structure may be a lateral direction parallel to the first surface.

According to an embodiment, the gate structure may be a trench gate structure. A trench gate structure is a gate structure having the gate dielectric and the gate electrode arranged in a gate trench extending into the SiC semiconductor body. A flow direction of a current through the channel may deviate from the lateral direction (so-called "vertical channel") and may correspond to a direction perpendicular to the first surface or to a direction parallel to a sidewall taper of the gate trench. Such a vertical channel is also possible at least in places in the case of a planar gate structure.

The junction material in the first trench may be a material or a material combination forming a diode with the SiC semiconductor body adjoining the junction material.

According to an embodiment, the diode may be a Schottky diode and the junction material may be any metal or any combination of metals forming a Schottky barrier with the SiC semiconductor body. Exemplary metals or metal combinations forming a Schottky junction with n-type SiC are, inter alia, Ti, TiN, Ti/TiN, Mo, MoN, WN, for example.

According to an embodiment, the diode may be a unipolar or a bipolar junction diode such as a $nn^+$-junction diode, or a $pp^+$-junction diode, or a pn-junction diode, for example. The junction may be a homojunction in case of a junction material made of SiC, or a heterojunction in case of a junction material different from SiC. A unipolar or bipolar heterojunction diode may be formed between the SiC semiconductor body and a junction material made of polycrystalline silicon, for example.

According to an embodiment, the diode may be a combination of a Schottky diode and a unipolar or bipolar junction diode such as an $nn^+$-junction diode, or a $pp^+$-junction diode, or a pn-junction diode, for example. By way of example, the unipolar or bipolar junction diode may be formed by a first portion of the first trench and the Schottky diode may be formed by a second portion of the first trench.

The diode may have a lower forward voltage drop than an intrinsic bipolar body diode of the semiconductor device. For example, the forward voltage drop of the intrinsic bipolar diode in silicon carbide may be between 2.5V and 3V and the forward voltage drop across the diode in the first trench may be lower than 2V, e.g. lower than 1.5V.

The diode in the first trench may reduce turn-on losses, reverse-recovery losses and thermal stress in the semiconductor device. DC/DC converters that use, e.g., the semiconductor device as power switch in a rectification stage may show higher efficiency. Since the diode in the first trench may bypass the internal body diode for the complete SOA, bipolar degradation can be effectively reduced or avoided.

According to an embodiment the semiconductor device may further comprise a second trench extending from the first surface of the SiC semiconductor body into the SiC semiconductor body. The gate dielectric and the gate electrode may be arranged in the second trench. Thus, in this embodiment, a gate structure including the gate dielectric and the gate electrode is a trench gate structure.

A vertical extension of the gate structure may be in a range from 0.3 μm to 5 μm, e.g., in a range from 0.5 μm to 2 μm. Sidewalls of the second trench may be vertical or may taper with increasing distance to the first surface. A width of the gate structures in the plane of the first surface may be in a range from 500 nm to 5 μm, e.g., in a range from 1 μm to 3 μm.

The second trench may taper with increasing distance to the first surface. For example, a taper angle of the second trench with respect to the vertical direction may be equal to the off-axis angle α or may deviate from the off-axis angle α by not more than ±1 degree such that at least a first mesa sidewall of two opposite longitudinal mesa sidewalls is formed by a main crystal plane with high charge carrier mobility, e.g., a {11-20} crystal plane. A second mesa sidewall opposite to the first mesa sidewall may be tilted to a main crystal plane by twice the off-axis angle α, e.g., by 4 degree or more, for example, by about 8 degrees. Taper and dimensions of the second trench may correspond with the first trench, for example.

According to an embodiment a first width of the first trench at the first surface may correspond to a second width of the second trench at the first surface, and a first depth of the first trench with respect to the first surface may correspond to a second depth of the second trench with respect to the first surface. By way of example, the first and second trenches may be formed by a common lithography mask having equal widths of mask openings for forming the first and second trenches, for example. The first and second trenches may also differ with respect to width and/or depth, for example.

According to an embodiment the semiconductor device may further comprise a source region of a first conductivity type adjoining the gate dielectric at a first sidewall of the second trench. Thus, a channel (e.g. a MOS channel) may be limited to the first sidewall with respect to opposite first and second sidewalls of the second trench. The source region may also adjoin the gate dielectric at opposite first and second sidewalls of the second trench, respectively. Thereby, a channel (e.g. a MOS channel) may not only be formed at the first sidewall of the second trench but also at the second sidewall of the second trench.

According to an embodiment the semiconductor device may further comprise a body region of a second conductivity type adjoining the first sidewall of the second trench. The semiconductor device may further comprise a first shielding region of the second conductivity type adjoining the bottom of the second trench and adjoining the second sidewall of the second trench. The first shielding region may extend from the bottom of the second sidewall up to the first surface, for example. The first shielding region may be electrically connected via a contact on the first surface, for example. The first shielding region may also be formed below the bottom of the second trench and may adjoin (e.g. only adjoin) the bottom of the second trench. The first shielding region may be electrically connected at the bottom of the second trench, for example. The presence of the first shielding region may reduce the effective electric field at the bottom of the second trench.

According to an embodiment the gate dielectric and the gate electrode may be part of a planar gate electrode structure arranged on the first surface of the SiC semiconductor body. Thereby, a channel current may flow along a lateral direction parallel to the first surface at least in places, for example. This may allow for a simplified manufacturing process avoiding etching of gate trenches.

According to an embodiment the junction material includes at least one of: i) a metal or ii) doped polycrystalline silicon. The junction material may at least partly fill the first trench. The diode may be a Schottky diode formed by a Schottky junction between the SiC semiconductor body and the metal at least partly filling the first trench. Exemplary metals or metal combinations forming a Schottky junction with n-type SiC are, inter alia, Ti, TiN, Ti/TiN, Mo, MoN, WN, for example. The junction material may also be doped polycrystalline silicon and the corresponding diode may be a unipolar or a bipolar junction diode such as an $nn^+$-heterojunction diode, or a $pp^+$-heterojunction diode, or a pn-heterojunction diode, for example. According to an embodiment, the diode may be a combination of a Schottky diode and a unipolar or bipolar junction diode such as an $nn^+$-junction diode, or a $pp^+$-junction diode, or a pn-junction diode, for example. A doping concentration of the junction material may vary along the vertical direction, for example. The junction material may also include a plurality of different metals forming a plurality of Schottky junction diodes connected in parallel. The different metals may be arranged in different portions of the first trench, for example. The junction material may also include i) a semiconductor or a combination of semiconductors and ii) a metal or a combination of metals in different portions of the first trench, thereby forming i1) a Schottky diode and i2) a unipolar or bipolar junction diode such as an $nn^+$-junction diode, or a $pp^+$-junction diode, or a pn-junction diode connected in parallel, or any combination thereof.

According to an embodiment the first trench and the second trench may be arranged in a transistor cell array of the semiconductor device. The transistor cell array may be surrounded or partly surrounded by an edge termination structure, for example. The first trench being part of the diode may be arranged between transistor cells, e.g. between two second trenches, for example.

According to an embodiment a plurality of trenches, comprising the first trench, may be irregularly distributed over the transistor cell array. When dividing an area of a part or of the total transistor cell array at the first surface into n equal sub-areas, n being an integer between 4 and 100, a distribution of the plurality of trenches is considered irregular if a percentage of area of the plurality of trenches at the first surface differs by more than 10% among the n sub-areas. An irregular distribution of the plurality of trenches may allow for improving switching characteristics of the semiconductor device, for example.

According to an embodiment the plurality of the plurality of trenches are regularly (in other words: uniformly) distributed over the transistor cell array. When dividing an area of a part or of the total transistor cell array at the first surface into n equal sub-areas, n being an integer between 4 and 100, a distribution of the plurality of trenches is considered regular if a percentage of area of the plurality of trenches at the first surface differs by less than 10% among the n sub-areas.

According to an embodiment the gate electrode and the first trench may be stripe-shaped extending in parallel along a first lateral direction. By way of example, the gate electrode and the first trench may extend from a lateral end of a transistor cell array to an opposite lateral end of the transistor cell array.

According to an embodiment the semiconductor device may further comprise a second shielding region of the second conductivity type adjoining the bottom of the first trench. The first shielding region and the second shielding region may at least partly or entirely be formed by a common ion implantation processes, for example. In other words, one and the same ion implantation mask may be used for forming the first and second shielding regions, for example.

According to an embodiment a doping concentration profile of the first shielding region along a vertical extension (dimension) between a bottom of the second trench and a bottom of the first shielding region may correspond to a doping concentration profile of the second shielding region along the vertical extension, at least between a bottom of the first trench and a bottom of the second shielding region. For example, the doping concentration profile of the first shielding region below the bottom of the second trench may correspond to the doping concentration profile of the second shielding region below the bottom of the first trench. This may allow for reducing manufacturing effort of the diode when forming the first and second trenches together by a common etch process and when forming at least part of the first and second shielding regions together by a common ion implantation process. In addition or as an alternative, the first shielding region and the second shielding region may have the same doping concentration profile along at least one lateral direction.

According to an embodiment the first and second shielding regions may differ in at least one of a doping concentration profile along the vertical direction and a dimension along the vertical direction. By way of example, the first shielding region may extend from below a bottom of the second trench up to the first surface, and the second shielding region may extend from below a bottom of the first trench up to a vertical position below the first surface. In other words, the second shielding region may be buried below the first surface, for example. The second shielding region may be electrically coupled to the junction material in the first trench, for example.

According to an embodiment the semiconductor device may further comprise a drift region of the first conductivity type. Optionally, the semiconductor device may comprise a first current spread region of the first conductivity type arranged between the body region and the drift region. The first current spread region may adjoin the first sidewall of the second trench and the bottom of the second trench. A doping concentration of the first current spread region may be greater than a doping concentration of the drift region. The first current spread region may allow for a reduction of the on-state resistance by providing a low-ohmic current path for a load current leaving a channel region and being directed into the drift region to ward a drain contact at a second surface of the SiC semiconductor body opposite to the first surface.

According to an embodiment the first current spread region may be arranged between the first and second shielding regions, respectively. The first current spread region and the body region may form a pn-junction. The first current spread region may also be located at a vertical distance from the body region, for example.

According to an embodiment the semiconductor device may further comprise a second current spread region of the first conductivity type adjoining the bottom of the first trench. A doping concentration of the second current spread region may be greater than a doping concentration of the drift region, for example.

According to an embodiment the first and second current spread regions may differ in at least one of a doping concentration profile along the vertical direction and a dimension along the vertical direction. This may allow for a separate optimization of the electric shielding behavior around i) the diode in the first trench by the second current spread region, and ii) the gate structure in the second trench by the first current spread region, for example.

According to an embodiment a semiconductor device may comprise a SiC semiconductor body. The semiconductor device may further comprise a trench extending from a first surface of the SiC semiconductor body into the SiC semiconductor body. The semiconductor device may further comprise a gate dielectric adjoining a first sidewall and a bottom of the trench. The semiconductor device may further comprise a junction material adjoining a second sidewall of the trench and the bottom of the trench. The junction material and the SiC semiconductor body may form a diode. The embodiment may allow for a compact design of gate structure and diode by integrating the gate structure and the diode within a single trench and by utilizing opposite sidewalls of the trench for different functions, e.g. a MOSFET channel at the first sidewall and a diode at the second sidewall. Details with respect to the SiC semiconductor body, the gate dielectric, the gate electrode, the junction material and the diode described with respect to the embodiments above shall likewise apply to this embodiment. In this respect, the trench may correspond to the first trench described herein.

According to an embodiment the semiconductor device may further comprise a gate electrode in the trench, and a dielectric in the trench. The dielectric may provide an electrical insulation between the gate electrode and the junction material in the trench. The dielectric may include or consist of one layer or a combination of layers, e.g. a layer stack of dielectric layers, for example oxide layers such as thermal oxide layers or deposited oxide layers, e.g. LPCVD (Low Pressure Chemical Vapor Deposition) oxides using tetraethyl orthosilicate (TEOS) as precursor, PECVD (Plasma Enhanced Chemical Vapor Deposition) oxides, undoped silicate glass (USG), phosphosilicate glass (PSG), boron silicate glass (BSP), borophosphosilicate glass (BPSG), nitride layers, high-k dielectric layers or low-k dielectric layers.

According to an embodiment the semiconductor device may further comprise a shielding region of a second conductivity type adjoining a bottom of the trench. The shielding region may further adjoin at least part of a second sidewall of the trench. The presence of the shielding region may reduce the effective electric field at a bottom of the second trench, for example. In some embodiments, the shielding region may correspond to and/or comprise the same or similar features as the second shielding region described herein. According to an embodiment, the a current spread region may laterally adjoin the shielding region, for example.

According to an embodiment a method of manufacturing a semiconductor device may comprise providing a SiC semiconductor body. The method may further comprise forming a gate dielectric in contact with the SiC semiconductor body and a gate electrode in contact with the gate dielectric. The method may further comprise forming a first trench extending from a first surface of the SiC semiconductor body into the SiC semiconductor body. The method may further comprise forming a junction material in the first trench, wherein the junction material and the SiC semiconductor body form a diode. Details with respect to the SiC semiconductor body, the gate dielectric, the gate electrode, the junction material and the diode described with respect to the embodiments above shall likewise apply to this embodiment.

According to an embodiment a method of manufacturing a semiconductor device may comprise providing a SiC semiconductor body. The method may further comprise forming a trench extending from a first surface of the SiC semiconductor body into the SiC semiconductor body. The method may further comprise forming a gate dielectric adjoining a first sidewall and a bottom of the trench. The method may further comprise forming a junction material adjoining a second sidewall of the trench and the bottom of the trench. The junction material and the SiC semiconductor body may form a diode. Details with respect to the SiC semiconductor body, the gate dielectric, the gate electrode, the junction material and the diode described with respect to the embodiments above shall likewise apply to this embodiment.

The embodiments described above may be combined in any way.

The embodiments described above will be further illustrated with respect to exemplary figures described below.

Figure 1A:
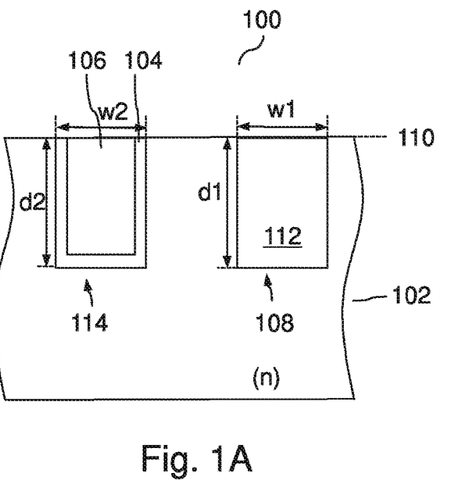
FIGS. 1A and 1B illustrate schematic cross-sectional views of an embodiment of a semiconductor device including a diode formed by a junction material in a trench, the semiconductor device further comprising a trench gate electrode (FIG. 1A) or a planar gate electrode (FIG. 1B).
Figure 1B:
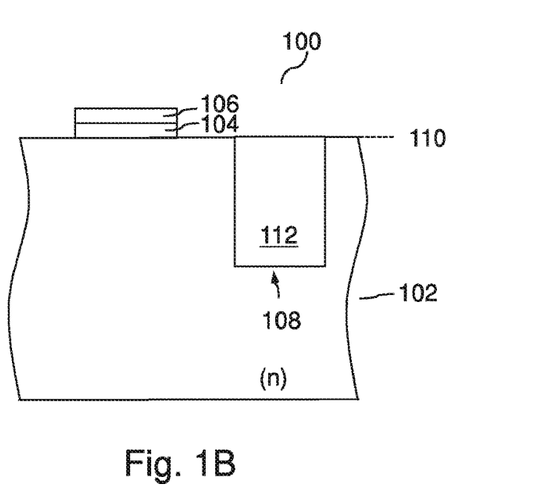

Referring to the schematic cross-sectional views of FIGS. 1A and 1B, a semiconductor device 100 includes a silicon carbide, SiC semiconductor body 102. The semiconductor device 100 further includes a gate dielectric 104 in contact with the SiC semiconductor body 102 and a gate electrode 106 in contact with the gate dielectric 104 constituting a gate structure. The semiconductor device further includes a first trench 108 extending from a first surface 110 of the SiC semiconductor body 102 into the SiC semiconductor body 102. The semiconductor device 100 further includes a junction material 112 in the first trench 108. The junction material 112 and the SiC semiconductor body 102 form a diode. Details with respect to the SiC semiconductor body, the gate dielectric, the gate electrode, the junction material and the diode described with respect to the embodiments above shall likewise apply to the exemplary embodiments illustrated in FIGS. 1A and 1B.

In the exemplary embodiment illustrated in FIG. 1A the gate structure is a trench gate structure. In other words, the gate dielectric 104 and the gate electrode 106 are arranged in a second trench 114 extending from the first surface 110 of the SiC semiconductor body 102 into the SiC semiconductor body 102. A first width w1 of the first trench 108 at the first surface 110 may correspond to a second width w2 of the second trench 114 at the first surface 110. A first depth d1 of the first trench 108 with respect to the first surface 110 may also corresponds to a second depth d2 of the second trench 114 with respect to the first surface 110. According to other embodiments, the first and second widths w1, w2 may also differ from one another. Likewise, also the first and second depths d1, d2 may differ from one another In the exemplary embodiment illustrated in FIG. 1B the gate structure is a planar gate structure. In other words, the gate dielectric 104 and the gate electrode 106 are arranged on the first surface 110 of the SiC semiconductor body 102.

Figure 2A:
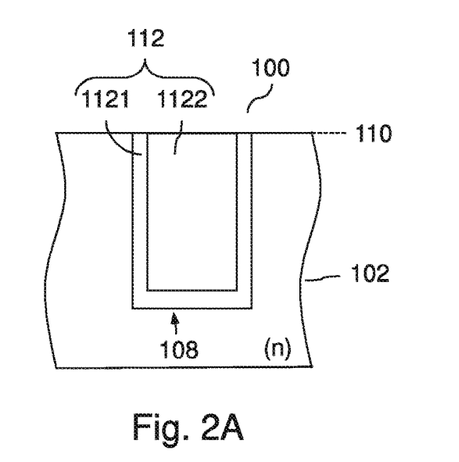
FIGS. 2A and 2B illustrate schematic cross-sectional views of embodiments of the junction material in the trench.

Referring to the schematic cross-sectional view of FIG. 2A, the junction material 112 in the first trench 108 may include a combination of materials 1121, 1122 in the form of a layer stack lining sidewalls and a bottom of the first trench 108. Although the layer stack illustrated in FIG. 2A is a dual layer, the number of stacked layers may be larger than two, for example three, four or even larger.

Figure 2B:
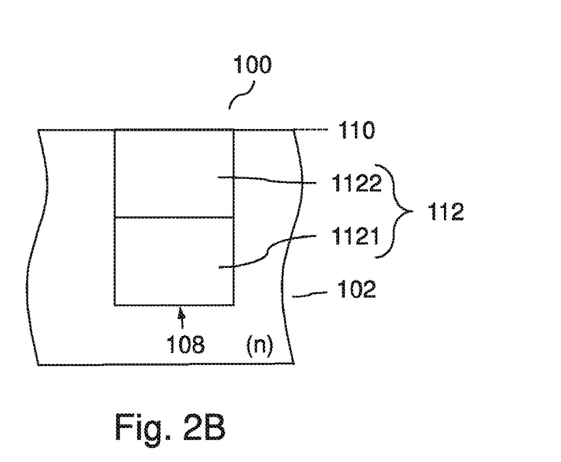

Referring to the schematic cross-sectional view of FIG. 2B, the junction material 112 in the first trench 108 may include a combination of materials 1121, 1122 stacked along a vertical direction. Although the stack illustrated in FIG. 2B includes two materials, the number of stacked materials may be larger than two, for example three, four or even larger. Thus, a parallel connection of any combination of different diodes, e.g. a Schottky junction diode, a $nn^+$-junction diode, a $pp^+$-junction diode, or a pn-junction diode may be achieved.

The junction material 112 may partly or completely fill the first trench 108, for example.

Figure 3:
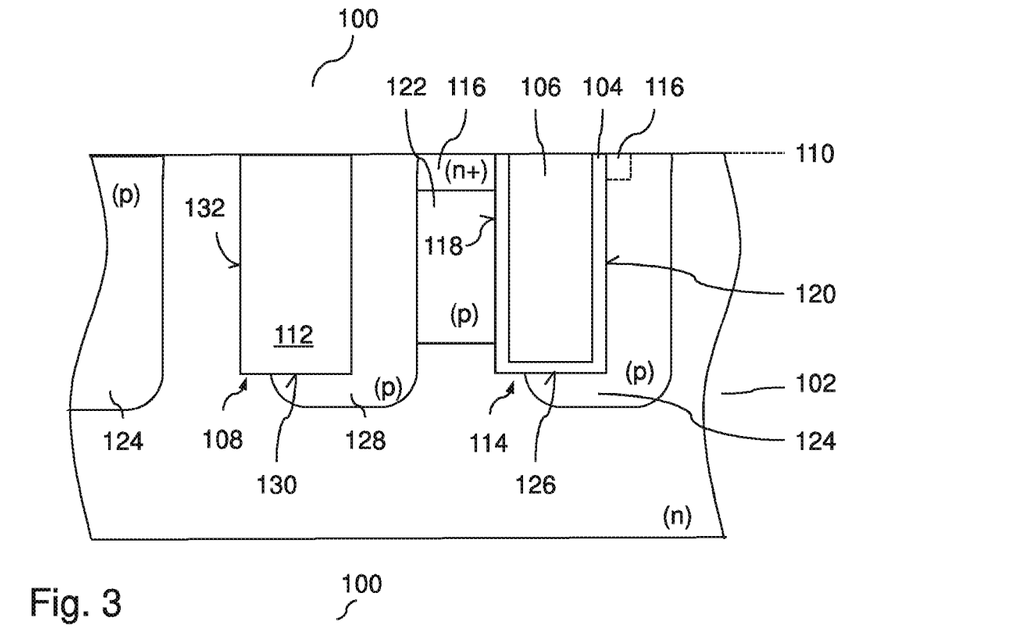
FIGS. 3 to 6 are schematic cross-sectional views for illustrating further embodiments of a semiconductor device.

Referring to the schematic cross-sectional view of FIG. 3, the semiconductor device 100 further comprises a source region 116 of a first conductivity type adjoining the gate dielectric 104 at a first sidewall 118 of the second trench 114. The source region 116 may optionally also adjoin the gate dielectric 104 at an opposite second sidewall 120 of the second trench 114. This optional arrangement of the source region 116 is illustrated in FIG. 3 by a dashed line. The semiconductor device 100 further comprises a body region 122 of a second conductivity type adjoining the first sidewall 118 of the second trench 114. The semiconductor device further comprises a first shielding region 124 of the second conductivity type adjoining a bottom 126 of the second trench 114 and the second sidewall 120 of the second trench 114. The semiconductor device 100 further comprises a second shielding region 128 of the second conductivity type adjoining a bottom 130 of the first trench 108.

In the exemplary embodiment illustrated in FIG. 3, the diode is formed at a first sidewall 132 of the first trench 108 (e.g., the diode may be formed only at the first sidewall 132).

Details with respect to the SiC semiconductor body, the gate dielectric, the gate electrode, the junction material, the diode, the first and second shielding regions described with respect to the embodiments above shall likewise apply to the exemplary embodiment illustrated in FIG. 3.

Figure 4:
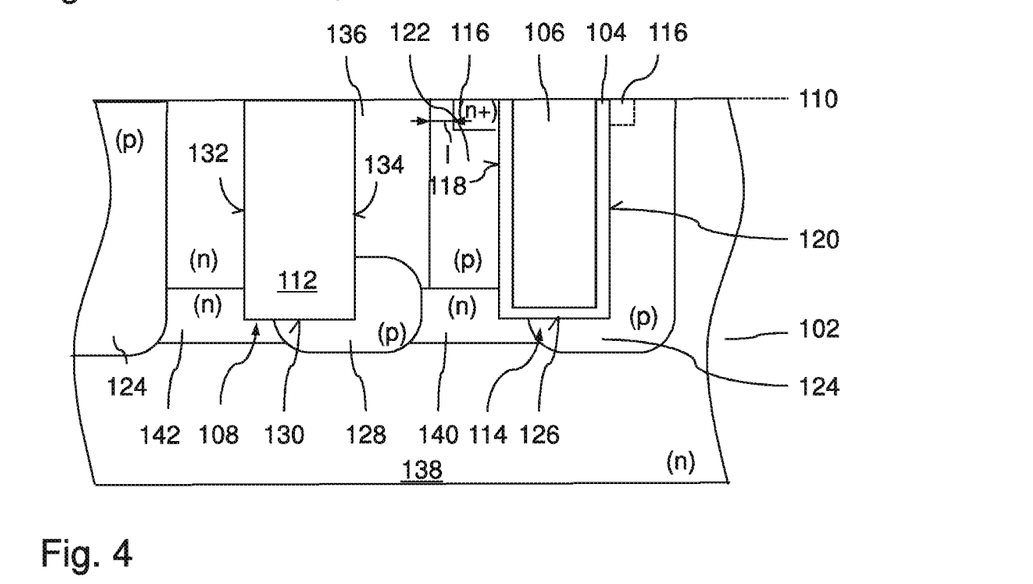

In the exemplary embodiment illustrated in the schematic FIG. 4, the diode is formed not only at the first sidewall 132 of the first trench 130 but also at a second sidewall 134 of the first trench 108. The diode at the second sidewall 134 may be formed by the junction material 112 and a diode region 136 of the first conductivity type adjoining the junction material 112 at the second sidewall 134. The diode region 136 may be formed by one or more ion implantation processes, for example. A dose of the one or more ion implantation processes for forming the diode region 136 may be appropriately adjusted for enabling counterdoping, for example. A lateral distance l between lateral ends of the source region 116 and the body region 122 may be appropriately set for avoiding a short circuit between source and drain, for example. The semiconductor device further comprises a drift region 138 of the first conductivity type and a first current spread region 140 of the first conductivity type arranged between the body region 122 and a drift region 138. The first current spread region 140 may adjoin the first sidewall 118 of the second trench 114 and the bottom 126 of the second trench 114. The semiconductor device 100 further comprises a second current spread region 142 of the first conductivity type adjoining the bottom 130 of the first trench 108.

Details with respect to the SiC semiconductor body, the gate dielectric, the gate electrode, the junction material, the diode, the first and second shielding regions and the first and second current spread regions described with respect to the embodiments above shall likewise apply to the exemplary embodiment illustrated in FIG. 4.

Figure 5:
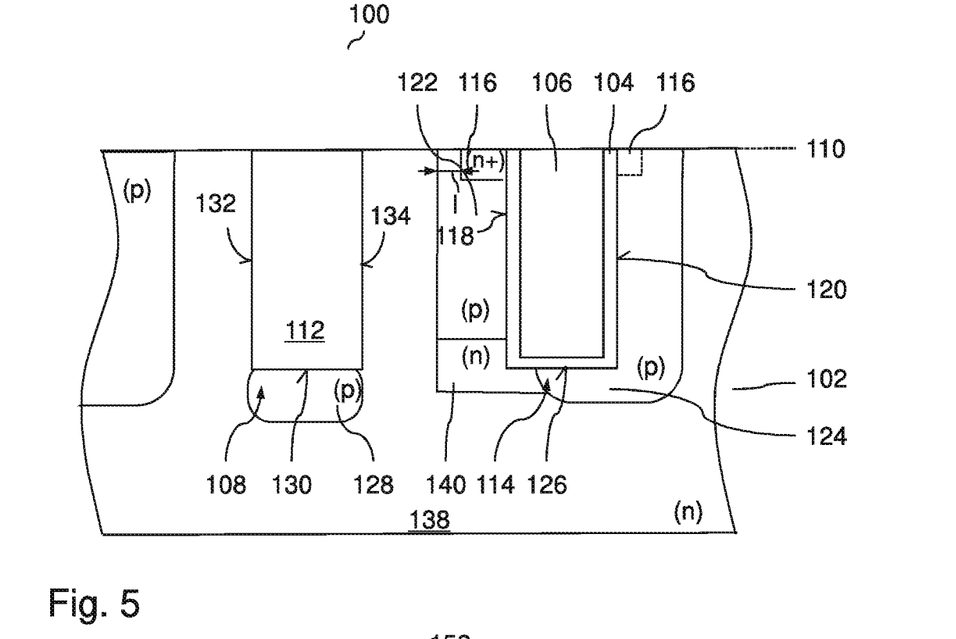

A compact design of transistor cells and the diode is illustrated with reference to the schematic cross-sectional view of FIG. 5. The second shielding region 128 is omitted at the second sidewall 134 of the first trench 108 and adjoins the bottom 108 of the first trench. Hence the diode is formed at both of the first and second sidewalls 132, 134 of the first trench 108.

A compact design of transistor cells and the diode is illustrated with reference to the schematic cross-sectional view of FIG. 6. The semiconductor device 100 comprises a trench 144 extending from the first surface 110 of the SiC semiconductor body 102 into the SiC semiconductor body 102. The gate dielectric 104 adjoins a first sidewall 146 and a bottom 148 of the trench 144. The semiconductor device 100 further comprises the junction material 112 adjoining a second sidewall 150 of the trench 144 and the bottom 148 of the trench 144. The junction material 112 and the SiC semiconductor body 102 form a diode. The junction material 112 and the gate electrode 106 are electrically insulated by an interlayer dielectric 152 in the trench 144. A shielding region 153 of the second conductivity type adjoins the bottom 148 of the trench 144.

Figure 6:
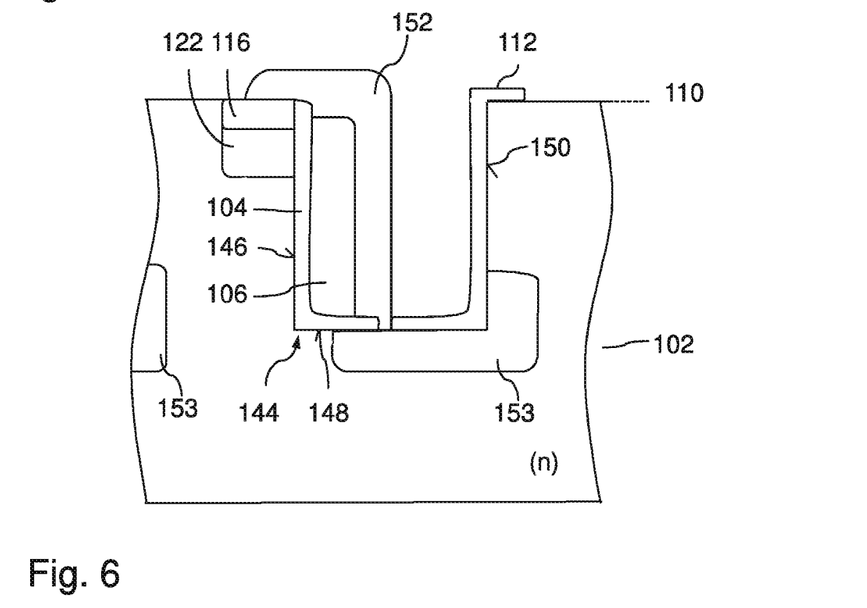

Details with respect to the SiC semiconductor body, the gate dielectric, the gate electrode, the junction material, the shielding region and the diode described with respect to the embodiments above shall likewise apply to the embodiment illustrated in FIG. 6.

Figure 7:
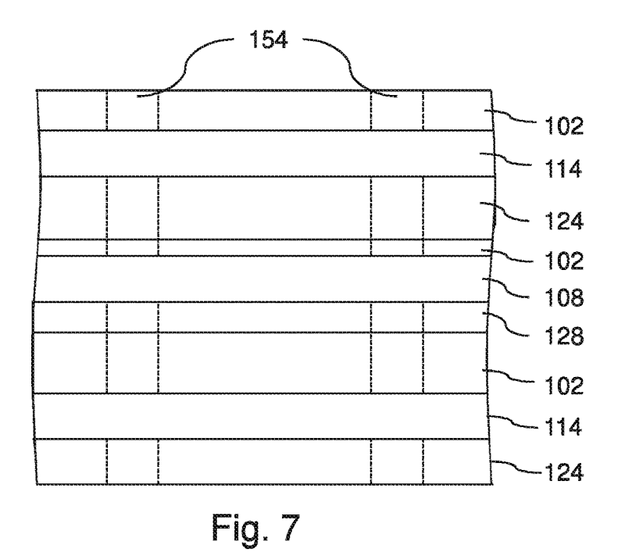
FIG. 7 is a schematic top view for illustrating an embodiment of a semiconductor device comprising semiconductor stripes.

Referring to the schematic top view of FIG. 7, selected regions of an embodiment of the semiconductor device 100 are illustrated. Semiconductor stripes 154 of the second conductivity, e.g. buried semiconductor stripes 154 or semiconductor stripes adjoining the first surface 110 type may run in parallel along a lateral direction different from an extension direction of the first trench 108, e.g. perpendicular to the extension direction of the first trench 108. The semiconductor stripes 154 may allow for improving an electric connection to the second shielding region 128, for example. The semiconductor stripes 154 may have a bottom at a same vertical distance to the first surface than the second shielding region 128, for example.

Figure 8A:
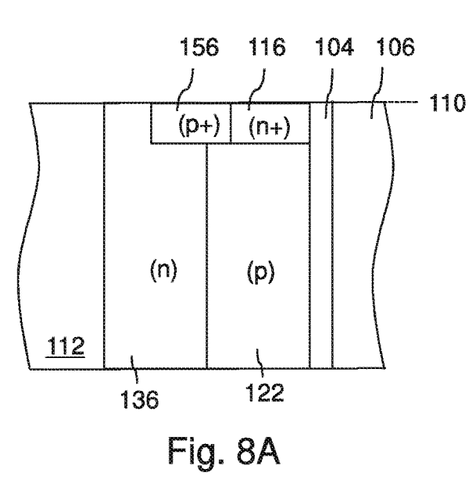
FIGS. 8A and 8B are schematic cross-sectional views for illustrating embodiments of a semiconductor device.
Figure 8B:
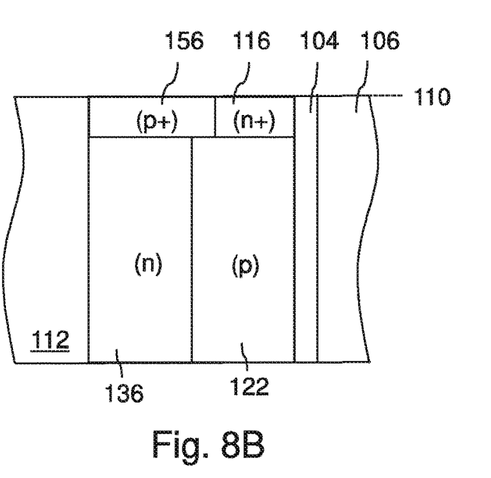

Referring to the schematic cross-sectional view of FIGS. 8A and 8B, a highly doped semiconductor region 156 of the second conductivity type may be formed at the first surface 110 overlapping with both the body region 116 and the diode region 136. The highly doped semiconductor region 156 of the second conductivity type may improve an electric connection of the body region 122 via the first surface 110 and may further suppress a short circuit between source and drain.

Figure 9:
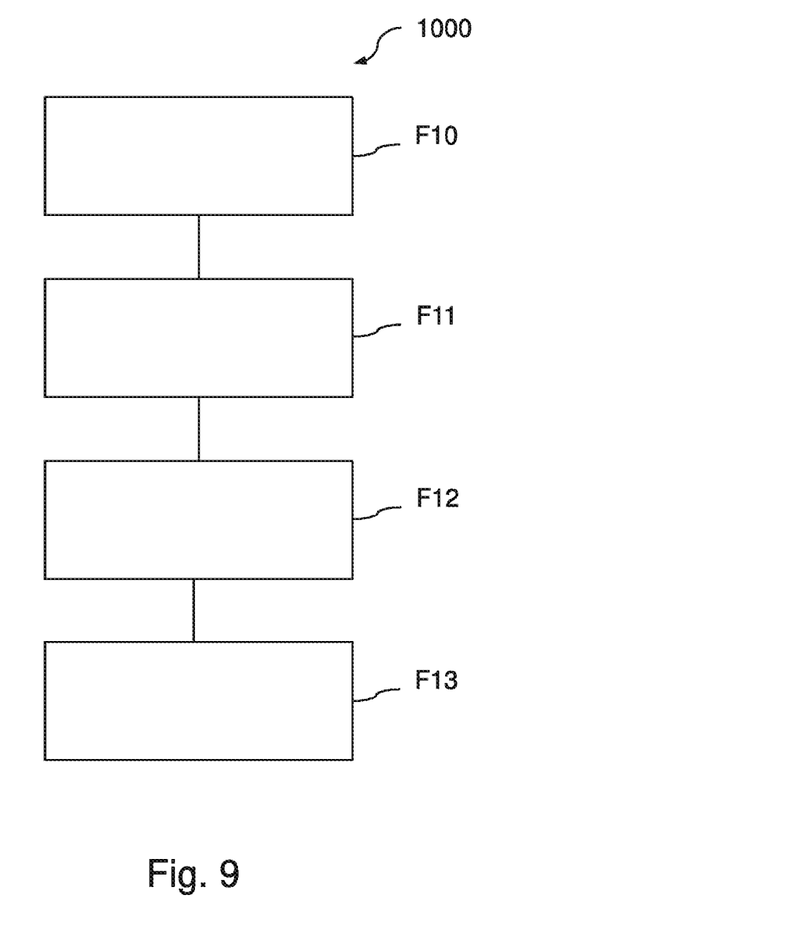
FIGS. 9 and 10 are schematic process flow diagrams for illustrating embodiments of manufacturing methods for a semiconductor device.

FIG. 9 is a schematic flow-chart for illustrating a method 1000 for manufacturing a semiconductor device.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all acts may be required to implement one or more aspects of embodiments of the disclosure herein. Also, one or more of the acts depicted herein may be divided in one or more separate sub-acts and/or phases.

Process feature F10 includes providing a SiC semiconductor body.

Process feature F11 includes forming a gate dielectric in contact with the SiC semiconductor body and a gate electrode in contact with the gate dielectric.

Process feature F12 includes forming a first trench extending from a first surface of the SiC semiconductor body into the SiC semiconductor body.

Process feature F13 includes forming a junction material in the first trench, wherein the junction material and the SiC semiconductor body form a diode.

In at least some embodiments of the method 1000, the following features (if applicable) apply, alone or in combination:

(i) forming at least one of the body region, the first shielding region, the second shielding region, the source region, the diode region, first current spread region, the second current spread region, the highly doped semiconductor region includes at least one masked or unmasked ion implantation process;

(ii) forming the first trench is carried out after act (i);

(iii) forming the second trench is carried out together with or after forming the first trench;

(iv) the gate dielectric and the gate electrode are formed in the first trench and in the second trench;

(v) the gate dielectric and the gate electrode are removed from the second trench;

(vi) the junction material is formed in the second trench after carrying out (ii) to (v);

(vii) the gate electrode and the junction material are formed by a common deposition process of polycrystalline silicon.

Figure 10:
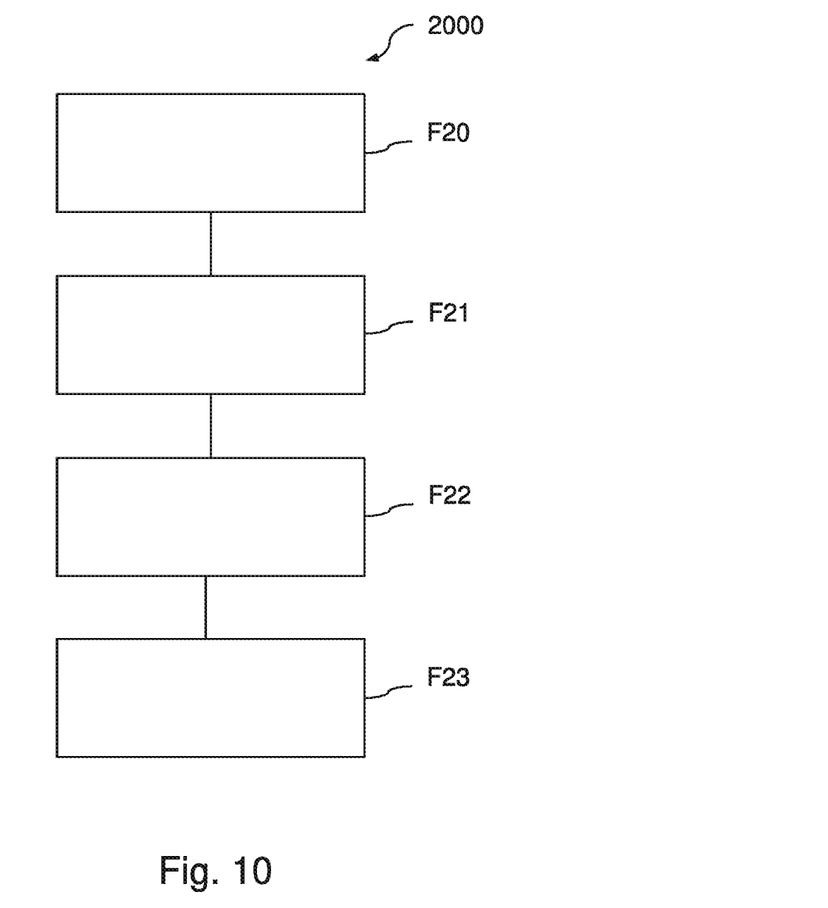

FIG. 10 is a schematic flow-chart for illustrating a method 2000 for manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all acts may be required to implement one or more aspects of embodiments of the disclosure herein. Also, one or more of the acts depicted herein may be divided in one or more separate sub-acts and/or phases.

Process feature F20 includes providing a SiC semiconductor body.

Process feature F21 includes forming a trench extending from a first surface of the SiC semiconductor body into the SiC semiconductor body.

Process feature F22 includes forming a gate dielectric adjoining a first sidewall and a bottom of the trench.

Process feature F23 includes forming a junction material adjoining a second sidewall of the trench and the bottom of the trench, wherein the junction material and the SiC semiconductor body form a diode.

In at least some embodiments of the method 2000, the following features (if applicable) apply, alone or in combination:

(i) forming at least one of the body region, the shielding region, the source region includes at least one masked or unmasked ion implantation process;

(ii) forming the first trench is carried out after (i);

(iii) the gate dielectric and the gate electrode are formed in the trench;

(iv) the gate dielectric and the gate electrode are removed from a part of the trench by a masked etch process;

(v) the junction material is formed in the part of the trench after carrying out (iv).

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device, comprising:
   a silicon carbide (SiC) semiconductor body;
   a gate dielectric in contact with the SiC semiconductor body;
   a gate electrode in contact with the gate dielectric;
   a first trench extending from a top surface of the SiC semiconductor body into the SiC semiconductor body; and
   a junction material in the first trench, wherein the junction material fills at least most of a volume of the first trench, wherein (i) the junction material that fills at least most of the volume of the first trench and (ii) the SiC semiconductor body form a diode.

2. The semiconductor device of claim 1, comprising a second trench extending from the top surface of the SiC semiconductor body into the SiC semiconductor body, wherein the gate dielectric and the gate electrode are arranged in the second trench.

3. The semiconductor device of claim 2, wherein a first width of the first trench at the top surface corresponds to a second width of the second trench at the top surface, and a first depth of the first trench with respect to the top surface corresponds to a second depth of the second trench with respect to the top surface.

4. The semiconductor device of claim 2, comprising a source region of a first conductivity type at least one of:
   adjoining the gate dielectric at a first sidewall of the second trench; or
   adjoining the gate dielectric at the first sidewall of the second trench and a second sidewall of the second trench opposite the first sidewall of the second trench.

5. The semiconductor device of claim 4, comprising a body region of a second conductivity type adjoining the first sidewall of the second trench, and a first shielding region of the second conductivity type adjoining a bottom of the second trench and adjoining the second sidewall of the second trench.

6. The semiconductor device of claim 1, wherein the gate dielectric and the gate electrode are part of a planar gate electrode structure arranged on the top surface of the SiC semiconductor body.

7. The semiconductor device of claim 1, wherein the junction material comprises at least one of a metal or doped polycrystalline silicon.

8. The semiconductor device of claim 2, wherein the first trench and the second trench are arranged in a transistor cell array of the semiconductor device.

9. The semiconductor device of claim 8, wherein a plurality of trenches, comprising the first trench and the second trench, is irregularly distributed over the transistor cell array.

10. The semiconductor device of claim 1, wherein the gate electrode and the first trench extend in parallel.

11. The semiconductor device of claim 5, comprising a second shielding region of the second conductivity type adjoining a bottom of the first trench.

12. The semiconductor device of claim 11, wherein a doping concentration profile of the first shielding region along a vertical extension between the bottom of the second trench and a bottom of the first shielding region corresponds to a doping concentration profile of the second shielding region along the vertical extension.

13. The semiconductor device of claim 11, wherein the first shielding region and the second shielding region differ in at least one of a doping concentration profile along a vertical direction or a dimension along the vertical direction.

14. The semiconductor device of claim 5, comprising a drift region of the first conductivity type and a first current spread region of the first conductivity type arranged between the body region and the drift region, wherein the first current spread region adjoins the first sidewall of the second trench and the bottom of the second trench, and wherein a doping concentration of the first current spread region is greater than a doping concentration of the drift region.

15. The semiconductor device of claim 14, comprising a second current spread region of the first conductivity type adjoining a bottom of the first trench, and wherein a doping concentration of the second current spread region is greater than a doping concentration of the drift region.

16. The semiconductor device of claim 15, wherein the first current spread region and the second current spread region differ in at least one of a doping concentration profile or a dimension.

17. A semiconductor device, comprising:
   a silicon carbide (SiC) semiconductor body;
   a trench extending from a first surface of the SiC semiconductor body into the SiC semiconductor body;
   a gate dielectric adjoining a first sidewall of the trench and a bottom of the trench; and
   a junction material adjoining a second sidewall of the trench and the bottom of the trench, wherein the junction material and the SiC semiconductor body form a diode.

18. The semiconductor device of claim 17, comprising a gate electrode in the trench, and a dielectric in the trench, wherein the dielectric provides an electrical insulation between the gate electrode and the junction material.

19. A method of manufacturing a semiconductor device, the method comprising:
   providing a silicon carbide (SiC) semiconductor body;
   forming a gate dielectric in contact with the SiC semiconductor body;
   forming a gate electrode in contact with the gate dielectric;
   forming a first trench extending from a first surface of the SiC semiconductor body into the SiC semiconductor body; and
   forming a junction material in the first trench, wherein the junction material fills at least most of a volume of the first trench, wherein (i) the junction material that fills at least most of the volume of the first trench and (ii) the SiC semiconductor body form a diode.

20. A method of manufacturing a semiconductor device, the method comprising:
   providing a silicon carbide (SiC) semiconductor body;
   forming a trench extending from a first surface of the SiC semiconductor body into the SiC semiconductor body;
   forming a gate dielectric adjoining a first sidewall of the trench and a bottom of the trench; and
   forming a junction material adjoining a second sidewall of the trench and the bottom of the trench, wherein the junction material and the SiC semiconductor body form a diode.

21. A semiconductor device, comprising:
a silicon carbide (SiC) semiconductor body;
a gate dielectric in contact with the SiC semiconductor body;
a gate electrode in contact with the gate dielectric;
a first trench extending from a first surface of the SiC semiconductor body into the SiC semiconductor body;
a junction material in the first trench, wherein the junction material and the SiC semiconductor body form a diode;
a second trench extending from the first surface of the SiC semiconductor body into the SiC semiconductor body, wherein the gate dielectric and the gate electrode are arranged in the second trench;
a source region of a first conductivity type at least one of:
adjoining the gate dielectric at a first sidewall of the second trench; or
adjoining the gate dielectric at the first sidewall of the second trench and a second sidewall of the second trench opposite the first sidewall of the second trench;
a body region of a second conductivity type adjoining the first sidewall of the second trench;
a first shielding region of the second conductivity type adjoining a bottom of the second trench and adjoining the second sidewall of the second trench; and
a second shielding region of the second conductivity type adjoining a bottom of the first trench.

* * * * *